US010366945B2

(12) United States Patent
Nakabayashi

(10) Patent No.: US 10,366,945 B2
(45) Date of Patent: Jul. 30, 2019

(54) LEAD FRAME, LEAD FRAME WITH RESIN ATTACHED THERETO, RESIN PACKAGE, LIGHT EMITTING DEVICE, AND METHOD FOR MANUFACTURING RESIN PACKAGE

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/427,711

(22) Filed: Feb. 8, 2017

(65) Prior Publication Data

US 2017/0213946 A1    Jul. 27, 2017

Related U.S. Application Data

(63) Continuation of application No. 14/447,231, filed on Jul. 30, 2014, now Pat. No. 9,607,934.

(30) Foreign Application Priority Data

Jul. 31, 2013  (JP) ................................ 2013-158442
Jun. 27, 2014  (JP) ................................ 2014-133120

(51) Int. Cl.
    *H01L 23/495*    (2006.01)
    *H01L 21/48*     (2006.01)
    (Continued)

(52) U.S. Cl.
    CPC .... *H01L 23/49541* (2013.01); *H01L 21/4842* (2013.01); *H01L 24/97* (2013.01);
    (Continued)

(58) Field of Classification Search
    CPC ... H01L 23/49541; H01L 24/97; H01L 33/62; H01L 21/4842; H01L 2924/181;
    (Continued)

(56) References Cited

U.S. PATENT DOCUMENTS 6,373,078 B1    4/2002  Yea
6,621,223 B1    9/2003  Hen
(Continued)

FOREIGN PATENT DOCUMENTS

JP    H04-307975 A      10/1992
JP    2003-133501 A     9/2003
(Continued)

OTHER PUBLICATIONS

Extended European Search Report dated Dec. 12, 2014 issued in Application No. 14178814.1.
(Continued)

*Primary Examiner* — Latanya N Crawford
(74) *Attorney, Agent, or Firm* — Foley & Lardner LLP

(57) ABSTRACT

A lead frame includes at least one row of a plurality of unit regions arranged in a first direction. Each of the unit regions includes: a first lead; a second lead; and an isolation region configured to isolate the first lead from the second lead, the isolation region including a bent portion that is located at an end part of the second lead. The first lead has an extending portion extending along the end part of the second lead. The plurality of unit regions includes a first unit region, and a second unit region that is adjacent to the first unit region in the first direction. The first lead of the first unit region is connected to the first lead or second lead of the second unit region via the extending portion.

16 Claims, 7 Drawing Sheets

(51) Int. Cl.
*H01L 33/62* (2010.01)
*H01L 23/00* (2006.01)
*H01L 33/54* (2010.01)
*H01L 33/56* (2010.01)

(52) U.S. Cl.
CPC .............. *H01L 33/54* (2013.01); *H01L 33/56* (2013.01); *H01L 33/62* (2013.01); *H01L 2224/48091* (2013.01); *H01L 2224/48247* (2013.01); *H01L 2224/48465* (2013.01); *H01L 2924/181* (2013.01); *H01L 2933/005* (2013.01); *H01L 2933/0066* (2013.01)

(58) Field of Classification Search
CPC . H01L 2224/48465; H01L 2224/48091; H01L 2224/48247; H01L 2933/0066
See application file for complete search history.

(56) References Cited

U.S. PATENT DOCUMENTS

| | | | |
|---|---|---|---|
| 7,719,024 | B2 | 5/2010 | Bando |
| 8,120,151 | B2 | 2/2012 | Ishi et al. |
| 8,125,136 | B2 | 2/2012 | Su et al. |
| 8,508,114 | B2 | 8/2013 | Su et al. |
| 8,933,548 | B2 | 1/2015 | Oda et al. |
| 2007/0145403 | A1 | 6/2007 | Tomioka et al. |
| 2007/0241357 | A1 | 10/2007 | Yan |
| 2008/0151557 | A1 | 6/2008 | Su et al. |
| 2010/0155771 | A1 | 6/2010 | Bando |
| 2011/0186875 | A1 | 8/2011 | Egoshi et al. |
| 2012/0025227 | A1 | 2/2012 | Chan et al. |
| 2012/0025361 | A1 | 2/2012 | Ito et al. |
| 2012/0120668 | A1 | 5/2012 | Su et al. |
| 2012/0319150 | A1 | 12/2012 | Shimomura et al. |
| 2013/0105851 | A1 | 5/2013 | Kim et al. |
| 2013/0153932 | A1 | 6/2013 | Takeuchi et al. |
| 2013/0221509 | A1 | 8/2013 | Oda et al. |
| 2014/0054629 | A1 | 2/2014 | Kim |
| 2014/0252574 | A1 | 9/2014 | Nakabayashi et al. |
| 2014/0353710 | A1* | 12/2014 | Zitzlsperger ............ H01L 24/97 257/99 |
| 2015/0076549 | A1* | 3/2015 | Gebuhr .................. H01L 24/97 257/99 |
| 2015/0200138 | A1* | 7/2015 | Schlereth ............... H01L 22/10 257/666 |

FOREIGN PATENT DOCUMENTS

| | | |
|---|---|---|
| JP | 3130684 U | 4/2007 |
| JP | 2007-134376 A | 5/2007 |
| JP | 2007-180227 A | 7/2007 |
| JP | 2009-302241 A | 12/2009 |
| JP | 2010-098227 A | 4/2010 |
| JP | 2010-153518 A | 7/2010 |
| JP | 2012-089547 A | 5/2012 |
| JP | 2012-191233 A | 10/2012 |
| JP | 2013-004807 A | 1/2013 |
| JP | 2013-026411 A | 4/2013 |
| JP | 2013-131638 A | 7/2013 |
| JP | 2013-140892 A | 7/2013 |
| JP | 2014-150244 | 8/2014 |
| WO | WO-2013/092387 A1 | 6/2013 |

OTHER PUBLICATIONS

Final Office Action issued in U.S. Appl. No. 14/447,231 dated Jun. 30, 2016.
Non-Final Office Action issued in U.S. Appl. No. 14/447,231 dated Apr. 24, 2015.
Non-Final Office Action issued in U.S. Appl. No. 14/447,231 dated Dec. 18, 2015.
Notice of Allowance issued in U.S. Appl. No. 14/447,231 dated Nov. 9, 2016.

* cited by examiner

LEAD FRAME, LEAD FRAME WITH RESIN ATTACHED THERETO, RESIN PACKAGE, LIGHT EMITTING DEVICE, AND METHOD FOR MANUFACTURING RESIN PACKAGE

CROSS-REFERENCE TO RELATED APPLICATIONS

The present application is a continuation of U.S. patent application Ser. No. 14/447,231, filed on Jul. 30, 2014, which claims priority under 35 U.S.C. § 119 to Japanese Patent Application No. 2013-158442, filed on Jul. 31, 2013 and Japanese Patent Application No. 2014-133120, filed on Jun. 27, 2014. The contents of these applications are incorporated herein by reference in their entireties.

BACKGROUND OF THE INVENTION

Field of the Invention

The disclosure relates to a lead frame, a lead frame with resin attached thereto, a resin package, a light emitting device, and a method for manufacturing a resin package.

Description of the Related Art

Light emitting devices, for example, using a LED, are fabricated by mounting a LED in a resin package with positive and negative leads embedded therein, and covering the LED with a translucent resin. The resin package is produced by loading a lead frame with positive and negative leads formed thereat into a die, injecting a resin into cavities of the die formed corresponding to respective packages, curing the resin, and then separating the resin into the respective packages. In order to mold a plurality of resin packages collectively, the lead frame used for manufacturing the resin packages includes a repeated arrangement of unit regions each including the positive and negative leads. The term "unit region" as used herein means a region corresponding to each package. The "lead frame" as used herein means a plate-like member with a repeated arrangement of unit regions.

The lead frame needs to hold the positive and negative leads in a collected state across the unit regions. For this reason, the leads are coupled together between the adjacent unit regions, and then the coupled part is cut after the molding. Conventionally, various types of lead frame structures have been proposed. JP 2012-89547 A discloses a lead frame in which leads located between adjacent unit regions are coupled together by support pins.

JP 2012-191233 A discloses a reinforcing lead serving as a supporting pole as shown in FIG. 22. of JP 2012-191233A.

SUMMARY OF THE INVENTION

A first aspect of the invention provides a lead frame including at least one row of a plurality of unit regions repeatedly arranged in a first direction, each of the unit regions comprising: a first lead; and a second lead, wherein an isolation region for isolating the first and second leads from each other is bent at an end part of the second lead, wherein the first lead has an extending portion extending along the end part of the second lead, and wherein the first lead in one of the unit regions disposed adjacently in the first direction is connected to the first lead or second lead in the other adjacent unit region by the extending portion.

A second aspect of the invention provides a resin package comprising: a resin molded body with a concave portion; and a first lead and one or more second leads which are embedded in the resin molded body, the first and second leads being exposed at a bottom surface of the concave portion while being separated from each other, wherein the first lead comprises: a main portion; extending portions extending in opposite directions from a pair of first opposing corners of the main portion or from positions near the first opposing corners; and coupling portions provided at second opposing corners different from the pair of the first opposing corners of the main portion provided with the extending portions, or in positions near the second opposing corners, the coupling portions extending in opposite directions, and wherein ends of the extending portions and the coupling portions are exposed from four outer side surfaces of the resin molded body.

Another aspect of the invention provides a method for manufacturing a resin package, the method including the steps of:

(i) preparing a lead frame which comprises at least one row of a plurality of unit regions repeatedly arranged in a first direction, each of the unit regions comprising: a first lead; and a second lead, wherein an isolation region for isolating the first and second leads from each other, the isolation region being bent at an end part of the second lead, wherein the first lead has an extending portion extending along the end part of the second lead, and wherein the first lead in one of the unit regions disposed adjacently in the first direction is connected to the first lead or second lead in the other adjacent unit region by the extending portion;

(ii) preparing an upper die having a convex portion that is opposed to at least a part of the first lead and at least a part of the second lead in the unit region, and a lower die; and (iii) injecting resin into a cavity formed around the convex portion while the lead frame is held with at least the part of the first lead and at least the part of the second lead sandwiched by the convex portion and the lower die.

DETAILED DESCRIPTION OF THE EMBODIMENTS

Preferred embodiments according to the present invention will be described with reference to the accompanying drawings.

First Embodiment

Figure 1:
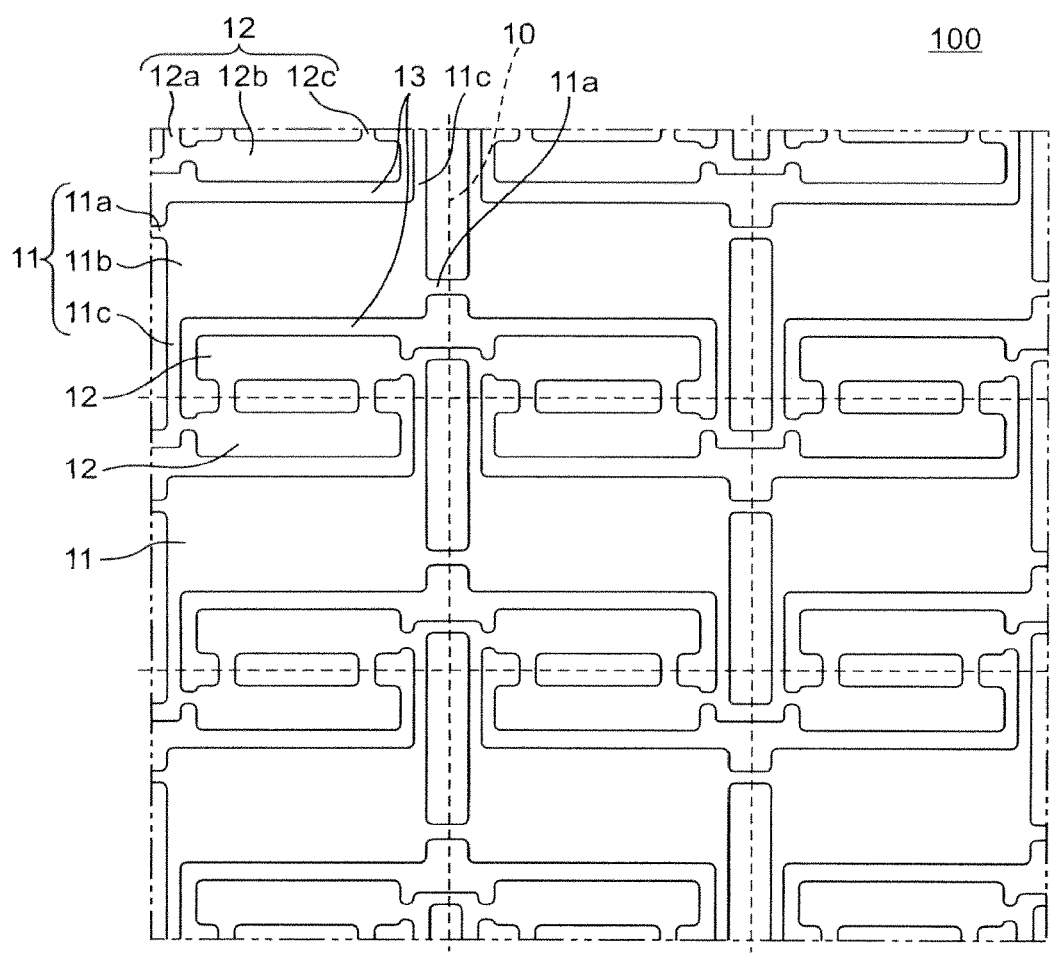
FIG. 1 is a plan view of a lead frame according to a first embodiment of the invention.

FIG. 1 shows a plan view of the structure of a lead frame 100 in a first embodiment of the invention. The lead frame 100 includes a repeated arrangement of unit regions 10 each including a first lead 11 and a second lead 12. Specifically, in the lead frame 100 of the first embodiment shown in FIG. 1, the unit regions 10 are arranged in the longitudinal direction (first direction) in rows, and these rows are arranged side by side (or arranged in parallel) in the lateral direction (second direction).

In each unit region 10, the first lead 11 and the second lead 12 are isolated from each other via an isolation region 13, and supported via other first and second leads 11 and 12 located in an adjacent unit region. That is, one lead frame is constructed by coupling the first leads 11 and second leads 12 in one or more portions of between the adjacent first leads 11, between the adjacent second leads 12, and between the first lead 11 and the second lead 12 in the adjacent unit regions.

The structure of the lead frame 100 of the first embodiment will be described in detail below.

In the lead frame 100 of the first embodiment, each unit region 10 has one first lead 11 and two second leads 12. The unit region 10 has point symmetry. The first lead 11 and the two second leads 12 in each unit region 10 are turned around the center of the unit regions 10 by 180 degrees to match the original shapes of these leads.

Specifically, in each unit region 10, the first lead 11 and the second lead 12 have respectively a main portion 11b and a main portion 12b each having a rectangular shape (oblong shape). The main portion 11b and the main portion 12b are arranged such that a long side of the main portion 11b is opposed to a long side of the main portion 12b with a predetermined distance therebetween. The first lead 11 has an extending portion 11c extending along the end part of the second lead 12 (short side of the main portion 12b). The end part of the second lead 12 (short side of the main portion 12b) and the extending portion 11c are opposed away from by a predetermined interval. In the way mentioned above, the isolation region 13 is formed to be continuously bent between the long side of the main portion 11b and the long side of the main portion 12b, and between the end part of the second lead 12 (short side of the main portion 12b) and the extending portion 11c. Here, a width of the isolation region is set to, for example, 50 µm to 300 µm.

The first lead 11 has the two extending portions 11c that extend from a pair of opposing corners of the main portion 11b in opposite directions. One of the two extending portions 11c extends along the end part of one of the two second leads 12 (first end part), whereas the other extending portion 11c extends along the end part of the other second lead 12 (first end part). The end part of the second lead 12 opposed to the extending portion 11c is hereinafter referred to as the "first end potion", and the end part positioned on the side opposite to the first end part is hereinafter referred to as the "second end part" as mentioned above by using brackets. In the first embodiment, the extending portion 11c is provided to extend from the corner of the main portion 11b, whereas in the first embodiment, the extending portion 11c may be provided to extend from a position near the corner of the main portion 11b. In this case, one of the two extending portions 11c may be provided to extend from the corner of the main portion 11b, and the other extend portion may be provided to extend from a position near the corner of the main portion 11b. The term "position near the corner of the main portion 11b" as used herein means a position in which a distance from the corner of the main portion 11b is shorter than that from the center of the long side.

Each of the extending portions 11c of the first lead 11 is coupled to the second end parts of the second lead 12 in another unit region disposed adjacently in the longitudinal direction. A part of the short side of the main portion 11b of the first lead 11 is coupled to a corresponding part of the short side of the main portion 11b of the first lead 11 in another adjacent unit region 10 that is disposed adjacently in the lateral direction via the first coupling portion 11a. The first lead 11 is connected to other first leads 11 in unit regions 10 disposed adjacent to both sides of the above first lead 11 in the lateral direction. Each first lead 11 (main portion 11b) includes two first coupling portions 11a. The two first coupling portions 11a are positioned near opposing corners different from a pair of corners of the main portion 11b with the extending portions 11c formed thereat. In this way, the first lead 11 is supported at four respective opposing corners thereto by the extending portions 11c and the first coupling portions 11a.

In the first embodiment, each first coupling portion 11a is provided near a corresponding one of the opposing corners, but may be provided directly at one of the opposing corners. In this case, one of the two coupling portions 11a may be provided to extend from the corner of the main portion 11b, and the other coupling portion may be provided to extend from a position near the corner of the main portion 11b. Here, the term "position near the corner of the main portion 11b" as used herein means a position in which a distance from the corner of the main portion 11b is shorter than distance from the center of the short side.

The second leads 12 are arranged side by side with a predetermined distance therebetween in the unit regions that are disposed adjacently in the longitudinal direction. The adjacent second leads 12 are coupled together at two points. Specifically, the second leads 12 are coupled via second coupling portions 12c at the two points near both end parts of the opposed long sides of the second leads 12. Between the second leads 12 in two unit regions adjacent in the lateral direction, the second end parts of the adjacent second leads, each being coupled to the corresponding extending portion 11c of the first lead 11, are coupled together via a third coupling portion 12a. In this way, the third coupling portion 12a for coupling the second end parts of the adjacent second leads 12 is integrally connected to the extending portion 11c of the first lead 11 adjacent to the third coupling portion in the longitudinal direction, in the vicinity of the second end of the second lead 12.

The lead frame 100 of the first embodiment with the structure mentioned above is loaded into a die, and a resin is injected into a cavity of the die and then cured. As a result, a plurality of resin packages is collectively fabricated. Each resin package includes a resin molded body 15 with a concave portion 16, and the first lead 11 and second lead 12 embedded in the resin molded body 15 and exposed at the bottom surface of the concave portion 16 while being separated from each other. For example, the die is constructed of two or more sub-dies that are separable from each other. One die (for example, an upper die) is provided with convex portions corresponding to the concave portions 16. During molding, the lead frame 100 is sandwiched between the upper surface of the convex portion and the other die (for example, a lower die). The upper die has the plurality of convex portions, each convex portion being opposed to at least a part of the first lead and at least a part of the second lead in each unit region. The lead frame 100 is loaded into the die, for example, such that the center of the unit region 10 is aligned with the center of the upper surface of the convex portion of one die. At this time, at least a part of the first lead and at least a part of the second lead are held while being sandwiched by the convex portions of the upper die and the lower die. In such a state, the resin is injected into the cavity formed around each convex portion, and then cured. For example, injection molding, and transfer molding can be preferably used as a molding method of the resin. The concave portion 16 and the bottom surface of the concave portion 16 are set so as to expose the first lead 11 and the second leads 12 located on both respective sides of the first lead via the isolation regions 13, at the bottom surface of the concave portion 16, preferably, so as to embed the extending portions 11c in the resin molded body 15. In other words, preferably, the convex portion of the upper die is formed to be opposed to a part of the first lead in a position other than the extending portions.

Figure 2:
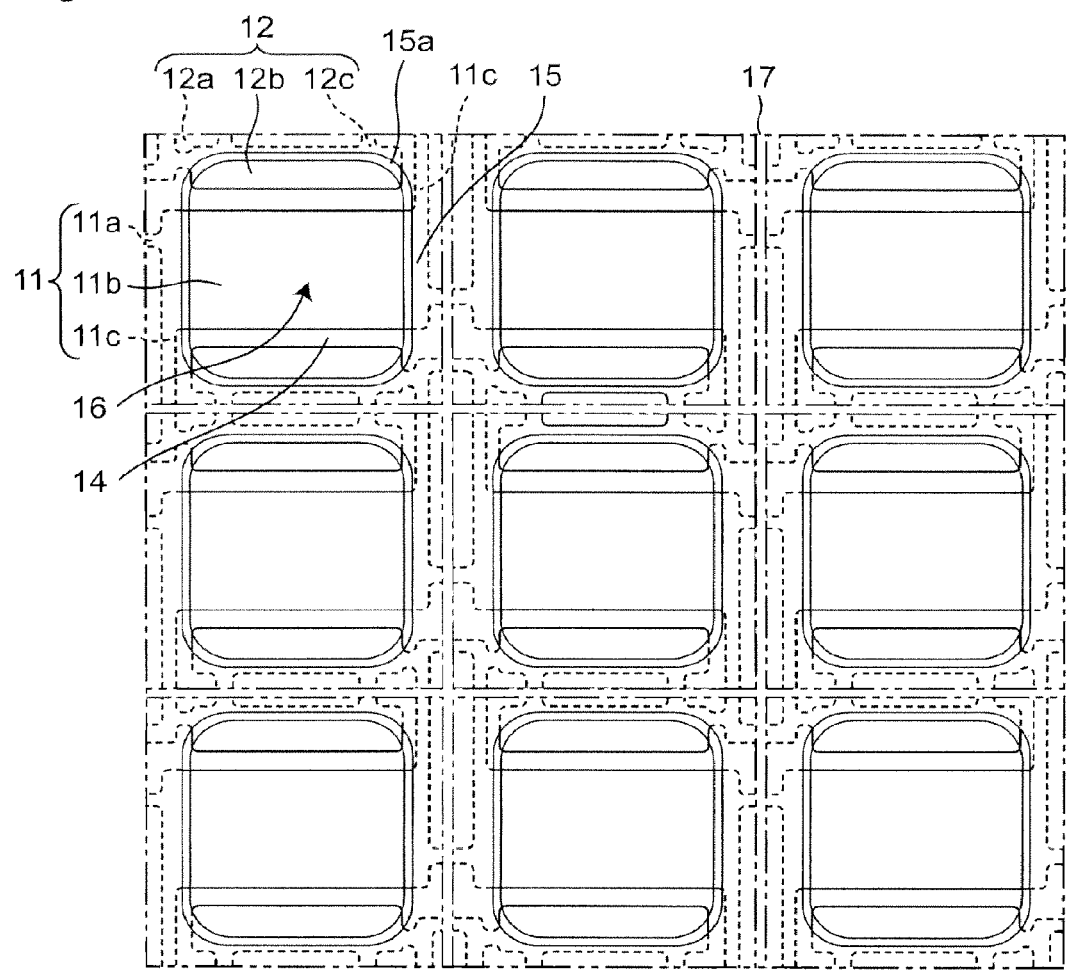
FIG. 2 is a plan view of the lead frame with resin molded to form a resin package according to the first embodiment.

The concave portion 16 is configured, for example, to have a sectional area thereof increasing from the bottom surface toward the upper surface. Referring to FIG. 2, a part designated by a reference numeral 15a is an inclined sidewall of the concave portion 16. Into the isolation region 13 of the lead frame 100, the resin is injected to form a resin isolation portion 14 made of the injected resin. After curing the resin, the resin is cut along a cutting line 17 into respective individual resin packages. In the way mentioned above, the resin package of the first embodiment is fabricated.

A dicing street width (width of a cut part) is in a range of, for example, approximately 0.1 mm to 0.3 mm. The size of the resin package is not specifically limited, but preferably has one side of a planar view of 1 mm to 5 mm, and its thickness of approximately 0.2 mm to 0.7 mm.

In the resin package with the structure mentioned above in the first embodiment, the resin molded body 15 is reinforced by the extending portions 11c of the first lead 11, which can prevent the occurrence of cracks in the resin part.

That is, if a resin isolation portion formed between the first and second leads 11 and 12 extends linearly from one side surface to the other side surface, cracking might occur in the resin isolation portion. In the resin package of the first embodiment, however, the resin isolation portion 14 is bent along the outline of the first lead 11 (specifically, the side surface of the main portion 11b and the side surface of the extending portion 11c). Thus, external force is less likely to be applied to the resin isolation portion 14. Even if an external force is applied to the resin isolation portion 14, the main portion 11b and the extending portions 11c can suppress deformation of the resin isolation portion 14, thereby preventing the occurrence of cracks in the resin portion.

In the lead frame 100 of the first embodiment, the isolation region 13 has the extending portion 11c that is produced by bending the first lead 11 at the corner of the end part of the second lead 12 to extend along the end part of the second lead 12. This can fabricate the resin package that suppresses the occurrence of cracks in the resin molded body 15.

In the lead frame 100 of the first embodiment, the first lead 11 is supported at four respective opposing corners thereof by the extending portions 11c and first coupling portions. The second lead 12 is coupled to the first lead 11 by the extending portions 11c, and additionally supported by coupling to another second lead 12 in the adjacent unit region at three points. This can suppress the deformation of the lead frame 100 to thereby permit upsizing of the lead frame 100.

Further, the lead frame 100 of the first embodiment holds the first and second leads 11 and 12 without providing a reinforcing lead, and thus can decrease the dicing street width (width of the cut part), resulting in an increase in the number of products.

Moreover, there is no need to cut the resin at every reinforcing lead, which can increase the cutting speed, thereby reducing the manufacturing cost.

Figure 3:
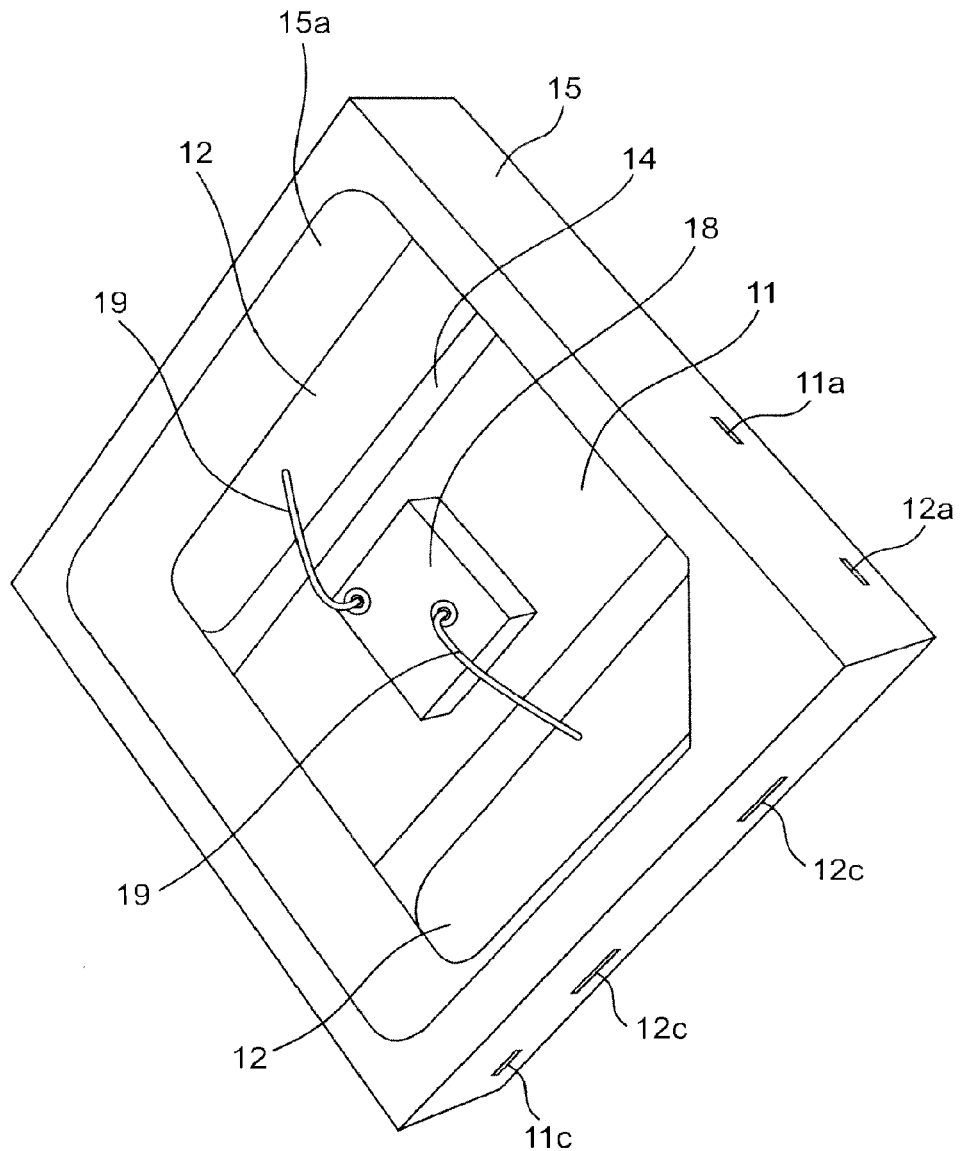
FIG. 3 is a perspective view of a light emitting device formed using the resin package that is manufactured using the lead frame of FIG. 1.

FIG. 3 is a perspective view of a light emitting device fabricated using the resin package of the first embodiment.

In the light emitting device shown in FIG. 3, a light emitting element 18 is die-bonded (mounted) on the first lead 11 exposed at the bottom surface of the concave portion 16 of the resin package. N-side electrode and p-side electrode of the light emitting element 18 are connected to one second lead 12 and the other lead 12 via wires 19, respectively.

In an example shown in FIG. 3, for example, one second lead 12 is a positive lead, and the other second lead 12 is a negative lead.

A cut surface (end surface) of the extending portion 11c is exposed at the outer side surface of the resin package (resin molded body). Likewise, cut surfaces of the first coupling portion 11a, second coupling portion 12c, and third coupling portion 12a are also exposed to the outer side surface of the resin package. The extending portion 11c, first coupling portion 11a, second coupling portion 12c, and third coupling portion 12a are thinned by half etching. FIG. 3 illustrates that the cut surface of the extending portion 11c or the like exposed to the outer side surface of the resin package is formed to be thin.

In the resin package shown in FIG. 3, preferably, the resin molded body has four outer side surfaces with one or more end parts of the extending portion 11c, first coupling portion 11a, second coupling portion 12c, and third coupling portion 12a exposed to the outer side surfaces.

For example, the main portion 11b of the first lead 11 and the main portion 12b of the second lead 12 are made to be thick and exposed from the backside of the resin molded body to form external connection terminals. In this case, if a boundary between the resin molded body and the side surface of the main portion 11b and a boundary between the resin molded body and the side surface of the main portion 12b are flat, the interfaces between the resin molded body and the side surfaces of the main portion 11b and 12b might be peeled off. However, the extending portion 11c, first coupling portion 11a, second coupling portion 12c, and third coupling portion 12a are exposed from the outer surface side of the package to form the convex portions at the boundary between the resin molded body and each of the side surfaces of the main portions 11b and 12b, thus preventing the peeling of the interface between the resin molded body and each of the side surfaces of the main portions 11b and 12b.

The light emitting device may include one or more kinds of phosphors disposed around the light emitting element 18 so as to convert a wavelength of at least a part of light emitted from the light emitting element 18 to another wavelength (converted to a longer wavelength).

In the light emitting device shown in FIG. 3, preferably, a sealing resin containing one or more kinds of phosphors is formed in the concave portion 16 of the resin package, whereby the phosphors are disposed around the light emitting element 18.

The sealing resin may contain a diffusing agent for diffusing light from the light emitting element 18 and the phosphors as required.

The surface shape of the sealing resin may be controlled to form a lens, thereby enhancing light extraction efficiency. Alternatively, a lens may be disposed on the sealing resin to enhance the light extraction efficiency.

Second Embodiment

Figure 4:
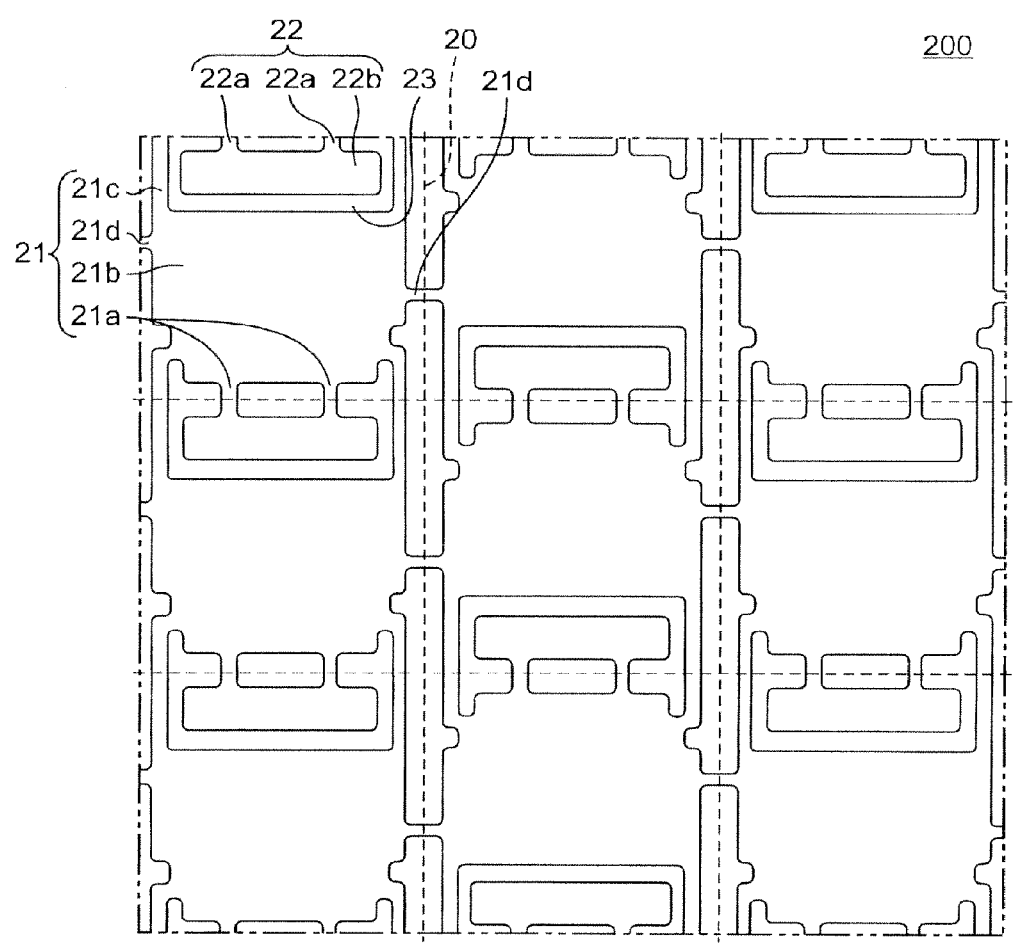
FIG. 4 is a plan view of another lead frame according to a second embodiment of the invention.

FIG. 4 is a plan view of the structure of a lead frame 200 according to a second embodiment of the invention.

The lead frame 200 of the second embodiment includes a repeated arrangement of unit regions 20 each including first and second leads 21 and 22, like the first embodiment. However, the lead frame 200 of the second embodiment differs from the first embodiment in that each unit region 20 includes one first lead 21 and one second lead 22.

The structure of the lead frame 200 of the second embodiment will be described in detail below.

In the lead frame 200 of the second embodiment, the first lead 21 and second lead 22 include a main portion 21b and a main portion 22b. The main portion 22b of the second lead 22 has a rectangular (oblong) shape. In each unit region 20, one side of the main portion 21b of the first lead 21 and one side (one long side) of the main portion 22b of the second lead 22 are arranged to be opposed with a predetermined distance therebetween. The first lead 21 has two extending portions 21c respectively extending along both short sides of the main portion 22b of the second lead 22. The short side of the main portion 22b of the second lead 22 is opposed to the extending portion 21c by a predetermined distance. In this way, the first lead 21 has extending portions 21c that extend along both short sides of the main portion 22b of the second lead 22 to form an isolation region 23 bent between the first lead 21 and the main portion 22b of the second lead 22.

That is, the isolation region 23 includes an isolation region linearly formed between one side of the main portion 21b of the first lead 21 and the long side of the main portion 22b of the second lead 22, and other isolation regions formed from both ends of the above isolation region along the short sides of the main portion 22b of the second lead 22.

The leads respectively located in the adjacent unit regions 20 are connected together in the following manner.

The extending portion 21c of the first lead 21 is coupled to the respective first leads 21 in the unit regions 20 disposed adjacent to each other in the longitudinal direction.

The first lead 21 is coupled to the second lead 22 in another unit region disposed adjacently in the longitudinal direction via coupling portions 21a at two positions on the other side opposite to one side of the main portion 21b (side on the isolation region 23 side). The coupling portions 21a are coupled to coupling portions 22a of the second lead 22 in another unit region disposed adjacently in the longitudinal direction.

The first lead 21 is coupled to another first lead 21 in another unit region 20 that is disposed adjacently in the lateral direction via a coupling portion 21d.

In this way, the first lead 21 is supported at four opposing corners connected to other first leads 21 in unit regions disposed adjacently in the longitudinal direction via the extending portions 21c. Further, the first lead 21 is supported by the coupling portion 21d connected to the first leads 21 in the unit regions 20 disposed adjacently in the lateral direction.

The lead frame 200 with the structure mentioned above in the second embodiment is loaded in a die, and resin is injected into a cavity of the die and then cured. As a result, a plurality of resin packages is collectively fabricated. Each resin package includes a resin molded body 25 with a concave portion 26, and the first lead 21 and second lead 22 embedded in the resin molded body 25 and exposed at the bottom surface of the concave portion 26 while being separated from each other.

Figure 5:
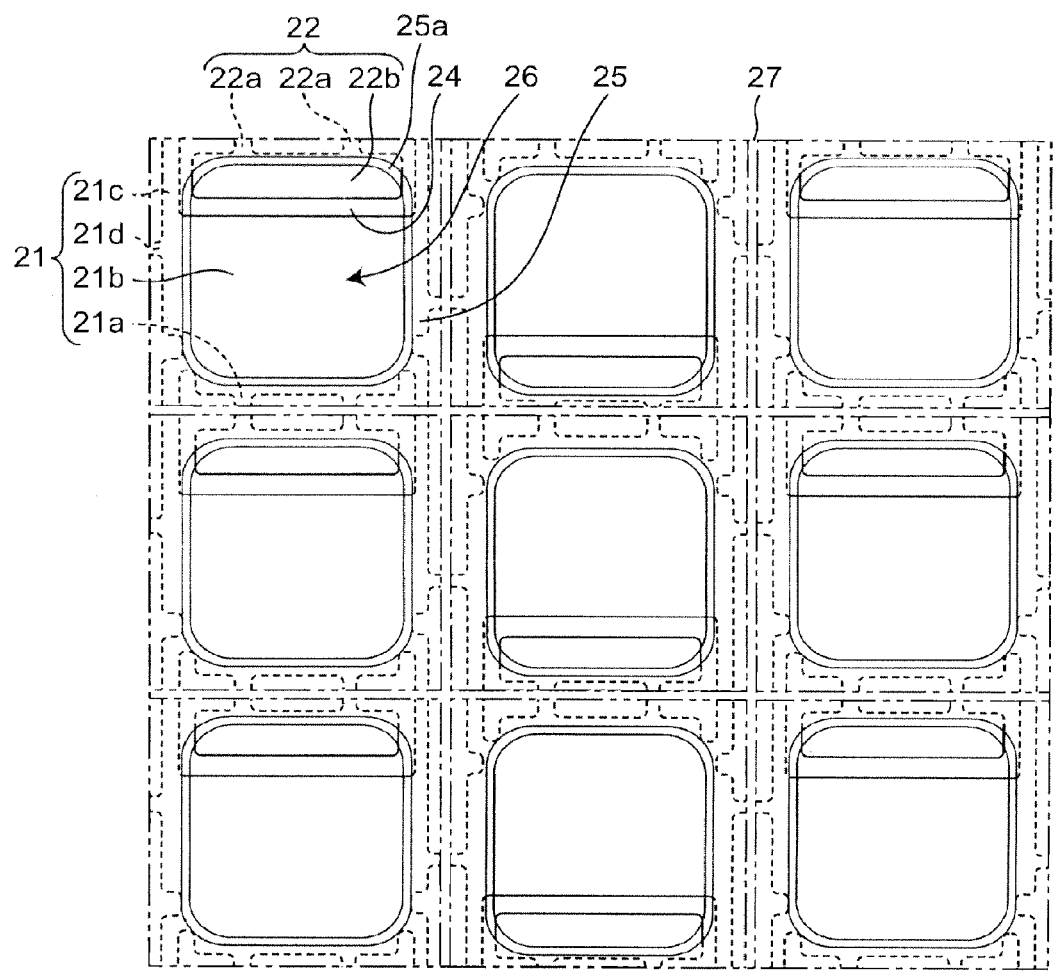
FIG. 5 is a plan view of the lead frame with resin molded to form a resin package according to the second embodiment.

Specifically, like the first embodiment, for example, a convex portion corresponding to the concave portion 26 is provided in an upper die as one of two or more sub-dies separable from each other. During molding, the lead frame 200 is sandwiched between the upper surface of the convex portion and a lower die as the other sub-die. Then resin is injected into a cavity of the die formed around the convex portion, and then cured. At this time, preferably, the extending portion 21c is embedded in the resin molded body 25. The concave portion 26 is configured, for example, to have its sectional area increasing from the bottom surface to the upper surface thereof. Referring to FIG. 5, a part designated by a reference numeral 25a is an inclined sidewall of the concave portion 26.

Into the isolation region 23 of the lead frame 200, the resin is injected, whereby a resin isolation portion 24 is made of the injected resin. After curing the resin, the resin is cut along a cutting line 27 into respective individual resin packages. In the way mentioned above, the resin package of the second embodiment is fabricated.

In the resin package with the structure mentioned above in the second embodiment, the resin molded body 25 is reinforced by the extending portions 21c of the first lead 21, which can prevent the occurrence of cracks in the resin molded body.

Particularly, in the second embodiment, the first lead 21 has the two extending portions 21c extending along both short sides of the main portion 22b, which can reinforce the resin molded body 25 on both sides of the resin isolation portion 24, thereby effectively preventing the occurrence of cracks in the resin molded body.

The lead frame 200 of this second embodiment can be used to fabricate a resin package in which the resin molded body 25 is reinforced by the extending portions 21c of the first lead 21, and also has the following advantages.

First, in the lead frame 200 of the second embodiment, the first lead 21 is supported at four opposing corners connected to other first leads 21 in unit regions disposed adjacently in the longitudinal direction via the extending portions 21c. Further, the first lead 21 is supported by the coupling portion 21d connected to the first leads 21 in the unit regions 20 disposed adjacently in the lateral direction. Such a support structure can suppress the deformation of the lead frame 200 to permit upsizing of the lead frame 200.

Further, the lead frame 200 of the second embodiment holds the first and second leads 21 and 22 without providing a reinforcing lead, and thus can decrease the dicing street width (width of the cut part), resulting in an increase in the number of products.

Moreover, there is no need to cut the resin at every reinforcing lead, which can increase the cutting speed, thereby reducing the manufacturing cost.

Third Embodiment

Figure 6:
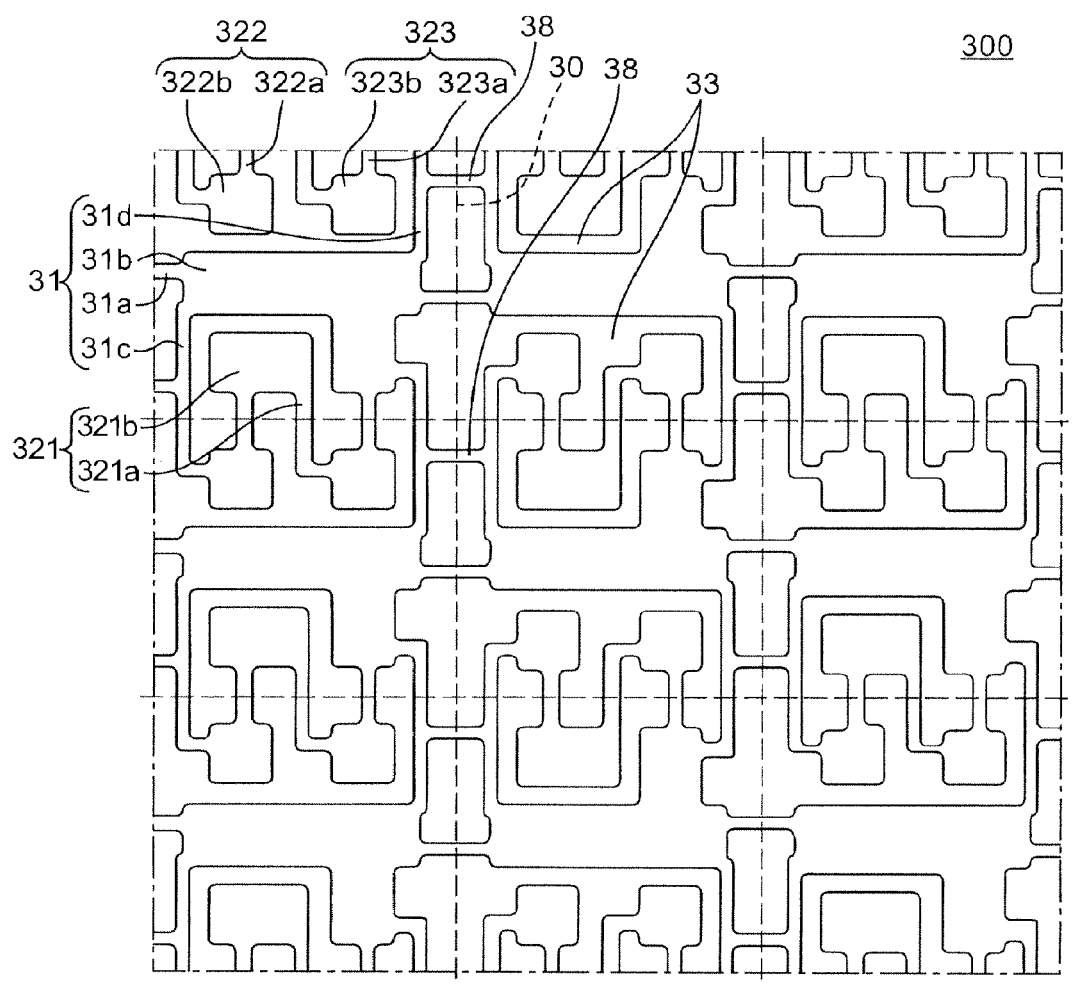
FIG. 6 is a plan view of a lead frame according to a third embodiment of the invention.

FIG. 6 is a plan view of the structure of a lead frame 300 according to a third embodiment of the invention.

The lead frame 300 of the third embodiment, like the first and second embodiments, includes a repeated arrangement of unit regions 30 each including a first lead 31 and second leads 321 to 323. However, unlike the first and second embodiments, each unit region 30 is constructed of one first lead 31 and three second leads 321 to 323.

The structure of the lead frame 300 in the third embodiment will be described in detail below.

The first lead 31 includes an L-like or reversed L-like main portion 31b, a coupling portion 31a, and two extending portions 31c and 31d. The main portion 31b of the first lead 31 includes a main body and protrusions that protrudes from the main body, and is formed in an L-like or reversed L-like shape. The main body is disposed at the center of the unit region 30. The second lead includes the second lead 321 having a main portion 321b and a coupling portion 321a, the second lead 322 having a main portion 322b and a coupling portion 322a, and a second lead 323 having a main portion 323b and a coupling portion 323a. The second lead 321 is provided in a region surrounded by the main body of the first lead 31 and the protrusion. The second lead 322 and the second lead 323 are disposed in parallel to the main body on a side opposite to the second lead 321.

The extending portion 31c of the first lead 31 extends downward in the longitudinal direction from a corner of one end part of the main portion 31b (corner of one end part of the main body), and is coupled to the second lead 322 disposed adjacently in a lower position in the longitudinal direction. As to the first lead 31 in each unit region 30, an end of the main body positioned close to the protrusion is hereinafter referred to as the other end, and another end of the main body positioned far away from the protrusion is referred to as one end. The extending portion 31d extends upward in the longitudinal direction from a corner of the other end part of the main portion 31b (corner of the other end part of the main body), and is coupled to the protrusion of another first lead 31 disposed adjacently in an upper position in the longitudinal direction. Between the adjacent unit regions 30, the extending portion 31c and the extending portion 31d are coupled together via a coupling bar 38. As mentioned above, the extending portion 31c and the extending portion 31d in the first lead 31 extend from the respective opposing corners of the main body in the opposite directions. The coupling portion 31a of the first lead 31 extends in the lateral direction from a corner of one end part of the main portion 31b. The coupling portion 31a is coupled to the other end (the other end of the main body) of the first lead 31 in another unit region 30 disposed adjacently in the lateral direction. The coupling portion 31a is provided near a corner of one end part of the main portion 31b that is different from the corner where the extending portion 31c is provided. With the structure mentioned above, the main body of the first lead 31 is supported at four corners thereof The coupling portion 321a of the second lead 321 extends from one end part of the main portion 321b, and is coupled to a main portion 323b of the second lead 323 in another unit region 30 disposed adjacently in a lower position in the longitudinal direction. The coupling portion 322a of the second lead 322 extends from one end part of the main portion 322b, and is coupled to the main portion 321b of the second lead 321 in another unit region 30 disposed adjacently in an upper position in the longitudinal direction. The coupling portion 323a of the second lead 323 extends from one end part of the main portion 323b, and is coupled to a tip end of the protrusion of another first lead 31 in another unit region 30 disposed adjacently in an upper position in the longitudinal direction.

With the structure mentioned above, the isolation region 13 is formed to be bent along the main portion 31b of the first lead 31 and the extending portion 31d. Further, an isolation region 33 is formed to be bent between the second lead 321 and the main body and protrusion of the main portion 31b. However, no isolation region is formed which connects one side of the unit region 30 to the other side thereof to linearly extend.

Figure 7:
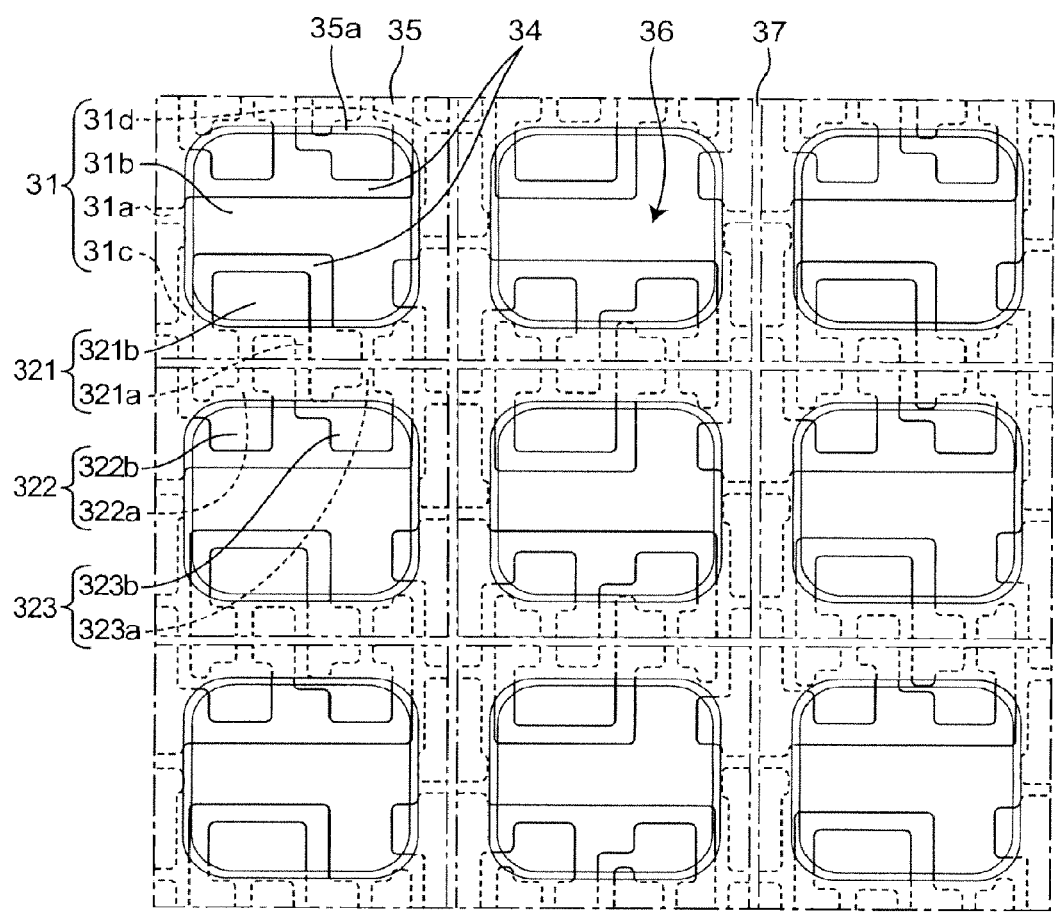
FIG. 7 is a plan view of the lead frame with resin molded to form a resin package according to the third embodiment.

The lead frame 300 with the structure mentioned above in the third embodiment is loaded into the die, and the resin is injected into a cavity of the die and then cured. As a result, a plurality of resin packages is collectively fabricated. Each resin package includes a resin molded body 35 with a concave portion 36, and the first lead 31 and the three second leads 321 to 323 embedded in the resin molded body 35 and exposed at the bottom surface of the concave portion 36, while being separated from each other. The concave portion 36 is configured, for example, to have its sectional area increasing from the bottom surface to the upper surface thereof Referring to FIG. 7, a part designated by a reference numeral 35a is an inclined sidewall of the concave portion 36.

Into the isolation region 33 of the lead frame 300, the resin is injected, whereby a resin isolation portion 34 is made of the injected resin. After curing the resin, the resin is cut along a cutting line 37 into respective individual resin packages. In the way mentioned above, the resin package of the third embodiment is fabricated.

In the resin package with the structure mentioned above in the third embodiment, the resin molded body is reinforced by the extending portions 31c and 31d of the first lead 31, which can prevent the occurrence of cracks in the resin molded portion.

In the lead frame 300 of the third embodiment, the isolation regions 33 bend at the corners of the end parts of the second leads 321 to 323 and the first lead 31 has the extending portions 31c and 31d extending along the end parts of the second leads 321 to 323. This allows fabrication of a resin package that can suppress the occurrence of cracks in the resin molded body.

In the lead frame 300 of the third embodiment, the main body of the first lead 31 is supported at four corners thereof by the extending portions 31c and 31d and the coupling portion 31a. This can suppress the deformation of the lead frame 300 to thereby permit upsizing of the lead frame.

Further, the lead frame 300 of the third embodiment holds the first and second leads 31 and 32 without providing a reinforcing lead, and thus can decrease the dicing street width (width of the cut part), resulting in an increase in the number of products.

Moreover, there is no need to cut the resin at every reinforcing lead, which can increase the cutting speed, thereby reducing the manufacturing cost.

In the embodiments as disclosed above, the lead frame can be formed of conductive material, which is one or more elements selected from the group consisting of, for example, aluminum, iron, nickel, copper, a copper alloy, a stainless steel, and an iron alloy including an invar alloy. The lead frame may be formed of a clad material containing different kinds of metals which are subjected to cladding. The lead frame is preferably plated with gold, silver, nickel, palladium, and an alloy thereof The thickness of the lead frame ranges, for example, from 50 μm to 1,000 μm, and preferably from 100 μm to 500 μm. The lead frame can be fabricated by changing its thickness according to the purpose. The thickness of the lead frame can be changed by etching (half-etching) or press working. When intending to change the thickness of the lead frame, the extending portion is preferably thinned, which can increase the cutting speed in separating the resin into individual resin packages, thereby reducing the manufacturing cost.

A concave portion whose part is thinned, or a convex portion whose part is thickened is formed in the main portion of the first lead and/or the main portion of the second lead of the lead frame. Thus, the resin is fitted into the concave portion, or the convex portion is fitted into the resin molded body, so that an adhesion area between the lead frame and the resin molded body can be increased to improve the adhesion therebetween.

The concave portion is preferably formed of a thinned part located along the outer periphery of the main portion of the first lead and/or the outer periphery of the main portion of the second lead. In this way, the concave portion is formed along the outer periphery of the main portion. For example, when etching the extending portion so as to decrease its thickness, the concave portion can be formed by forming the thin part leading to the extending portion along the outer periphery of the main portion.

Suitable molding materials for the resin molded bodies 15, 25, and 35 for use can include, for example, thermosetting resins such as an epoxy resin and a silicone resin, and thermoplastic resins such as a liquid crystal polymer, a polyphthalamide resin, and a polybutylene terephthalate resin (PBT). White pigments such as titanium oxide can be mixed into the molded material to improve the light reflection coefficient in the concave portions 16, 26, and 36 of the resin molded bodies 15, 25, and 35.

While the resin packages of the first to third embodiments mentioned above are formed of the resin molded body with the concave portions 16, 26, and 36, the invention is not limited thereto. Alternatively, the resin package of the invention may be composed of a flat plate-like resin molded body without any concave portion.

What is claimed is:

1. A lead frame comprising:
a plurality of first leads, and a plurality of second leads, wherein the first and second leads are arranged within a plurality of rectangular unit regions, wherein each of the plurality of unit region contains at least one of the first leads and at least one of the second leads, and wherein the plurality of unit regions includes a first unit region and a second unit region that are adjacent to each other in a first direction;
a plurality of coupling portions and a plurality of extending portions, wherein at least one of the coupling portions and at least one of the extending portions couple the first and second leads in the first unit region to the first and second leads in the second unit region, and wherein all of the plurality of coupling portions and the plurality of extending portions extend along the first direction and/or a second direction that is orthogonal to the first direction;
wherein, in a top plan view of the lead frame, in each of the plurality of unit regions, the coupling portions and extending portions do not extend directly along and over at least one of four sides of the unit region, and
wherein the plurality of coupling portions and the plurality of extending portions are disposed such that upper surfaces of the plurality of coupling portions and upper surfaces of the plurality of extending portions are coplanar.

2. The lead frame according to claim 1, wherein:
the plurality of unit regions includes a third unit region that is adjacent to the first unit region in the second direction;
in the top plan view, the first and second leads in the first unit region have the same shape as the first and second leads in the second unit region; and
in the top plan view, the first and second leads in the third unit region have a shape corresponding to the first and second leads of the first unit region being turned around a center of the first unit region by 180 degrees.

3. The lead frame according to claim 1, wherein:
the plurality of unit regions includes a third unit region that is adjacent to the first unit region in a second direction;
in the top plan view, the first and second leads in the first unit region have the same shape as the first and second leads in second unit region; and
in the top plan view, the first and second leads in the third unit region have a shape corresponding to the first and second leads of the first unit region being flipped end-over-end in the first direction.

4. The lead frame according to claim 1, wherein:
the plurality of unit regions includes a third unit region that is adjacent to the first unit region in the first direction, on a side of the first region opposite the second region; and
the plurality of extending portions includes a first extending portion that couples a first lead in the first unit region to a first lead in the second unit region, and a second extending portion that couples the first lead in the first unit region to a first lead in the third unit region.

5. The lead frame according to claim 1, wherein:
the plurality of unit regions includes a third unit region that is adjacent to the first unit region in the second direction;
the plurality of coupling portions including a first coupling portion that couples a first lead in the first unit region to a first lead in the third unit region, and a second coupling portion that couples a second lead in the first unit region to a second lead in the second unit region; and
the plurality of extending portions include at least one extending portion that couples the first lead in the first unit region to the second lead in the second unit region.

6. The lead frame according to claim 1, wherein:
each of the plurality of unit region contains at least two of the second leads; and
in each of the plurality of unit regions, the first lead is located between the second leads in the first direction.

7. A collectively fabricated resin package comprising:
a resin molded body; and
the lead frame of claim 1 embedded in the resin molded body such that, in the top plan view, the resin molded body extends along and over the four sides of each unit region so as to cover corresponding portions of adjacent unit regions.

8. The collectively fabricated resin package according to claim 7, wherein:
isolation regions are located laterally around the first leads and/or the second leads; and
the resin molded body includes isolation portions disposed in the isolation regions.

9. The lead frame according to claim 1, wherein:
the second lead in the first unit region and the second lead in the second unit region are coupled together via two of the coupling portions at two locations.

10. The lead frame according to claim 1, wherein:
the first lead in the first unit region and the second lead in the second unit region are coupled together via two of the coupling portions at two locations.

11. The lead frame according to claim 4, wherein:
at least a portion of the first extending portion and at least a portion of the second extending portion extend in the first direction.

12. The lead frame according to claim 1, wherein:
the plurality of coupling portion and the plurality of extending portion are thinner than a thickest portion of the lead frame, a direction orthogonal to the first and second directions.

13. The collectively fabricated resin package of claim 7, wherein:
the lead frame is exposed at the bottom surface of the resin package.

14. The collectively fabricated resin package of claim 7, wherein:
a concave portion is formed at the each unit region.

15. The collectively fabricated resin package of claim 7, wherein:
the resin molded body comprises a material selected from the group consisting of an epoxy resin, a silicone resin, a liquid crystal polymer, a polyphthalamide resin, and a polybutvlene terephthalate resin.

16. The collectively fabricated resin package of claim 7, wherein:
the resin molded body comprises a white pigment.

* * * * *